US011256947B2

United States Patent
Asano

(10) Patent No.: US 11,256,947 B2
(45) Date of Patent: Feb. 22, 2022

(54) PATTERN SHAPE MEASURING METHOD

(71) Applicant: TOSHIBA MEMORY CORPORATION, Tokyo (JP)

(72) Inventor: Mitsuyo Asano, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 255 days.

(21) Appl. No.: 16/565,774

(22) Filed: Sep. 10, 2019

(65) Prior Publication Data
US 2020/0302211 A1    Sep. 24, 2020

(30) Foreign Application Priority Data
Mar. 18, 2019    (JP) .............................. JP2019-049787

(51) Int. Cl.
*G06K 9/46* (2006.01)
*H01J 37/244* (2006.01)
*G03F 1/38* (2012.01)

(52) U.S. Cl.
CPC .............. *G06K 9/46* (2013.01); *H01J 37/244* (2013.01); *G03F 1/38* (2013.01); *H01J 2237/2817* (2013.01)

(58) Field of Classification Search
CPC ...... G06K 9/46; G06K 9/6209; G06K 9/4604; H01J 37/244; H01J 2237/2817; H01J 37/222; H01J 2237/22; G03F 1/38; G03F 1/86; G03F 1/84
See application file for complete search history.

(56) References Cited

U.S. PATENT DOCUMENTS

| 9,858,659 B2 | 1/2018 | Minakawa et al. |
| 2008/0028361 A1* | 1/2008 | Yamanaka ................ G03F 1/84 716/52 |
| 2008/0232671 A1* | 9/2008 | Asano ....................... G03F 1/86 382/144 |

(Continued)

FOREIGN PATENT DOCUMENTS

| JP | 3524853 B2 | 5/2004 |
| JP | 2011-197120 A | 10/2011 |

(Continued)

OTHER PUBLICATIONS

Chou et al., "The CD control improvement by using CDSEM 2D measurement of complex OPC patterns," Proc. of SPIE, 9985:99851M-1-1M-9 (Oct. 4, 2016).

*Primary Examiner* — Aaron W Carter
(74) *Attorney, Agent, or Firm* — Finnegan, Henderson, Farabow, Garrett & Dunner, LLP

(57) ABSTRACT

According to one embodiment, an image data of a measurement object including a pattern is acquired. First data is acquired by extracting a contour of an element in composition of the pattern from the image data. Second data that specifies a design data of the measurement object and the pattern of the measurement object is acquired. The design data includes a pattern data. A measurement pattern is extracted by using the first data and the second data. An evaluation value for the measurement pattern with respect to the design data is calculated based on the difference between the measurement pattern and the design data.

10 Claims, 17 Drawing Sheets

(56) References Cited

U.S. PATENT DOCUMENTS

| | | | | |
|---|---|---|---|---|
| 2008/0250380 A1* | 10/2008 | Kijima | ................ | G03F 7/70625 716/104 |
| 2009/0039263 A1* | 2/2009 | Matsuoka | ............. | G06T 7/0006 250/311 |
| 2009/0052765 A1* | 2/2009 | Toyoda | ................ | G06T 7/0004 382/149 |
| 2009/0232385 A1* | 9/2009 | Matsuoka | ............ | G06K 9/4609 382/145 |
| 2010/0128966 A1* | 5/2010 | Abe | ....................... | G06K 9/342 382/141 |
| 2011/0096309 A1* | 4/2011 | Paul Wiaux | ........ | G03F 7/70475 355/40 |
| 2012/0053892 A1* | 3/2012 | Matsuoka | ........... | G03F 7/70633 702/167 |
| 2016/0071261 A1* | 3/2016 | Yang | ....................... | H01L 22/12 382/149 |
| 2018/0293720 A1* | 10/2018 | Yoshitake | ................. | G06T 7/74 |
| 2020/0033122 A1* | 1/2020 | Toyoda | ................. | G01B 15/04 |
| 2020/0302211 A1* | 9/2020 | Asano | .................... | G06K 9/46 |

FOREIGN PATENT DOCUMENTS

| | | | |
|---|---|---|---|
| JP | 2014-81220 A | 5/2014 | |
| JP | 2018-56327 A | 4/2018 | |

\* cited by examiner

|  |  | 2D-MtT [nm] |
|---|---|---|
| MEASUREMENT PATTERN | PC1 | -3.18 |
|  | PC2 | -3.09 |
|  | PC3 | -2.79 |
|  | PC4 | -3.75 |
| NON-MEASUREMENT PATTERN | | -12.97 |

—— RESOLUTION PATTERN DATA
■ INFLECTION POINT

|  | PATTERN SHAPE EVALUATION VALUE OF EACH TYPE [nm] | | |
|---|---|---|---|
|  | CD MEASUREMENT VALUE | EPE MEASUREMENT (2D-MtT) | |
|  |  | ENTIRE CONTOUR | CALCULATION REGION |
| PATTERN OF Fig.13 | -0.84 | -3.76 | -0.58 |
| PATTERN OF Fig.16 | - | -2.55 | 0.03 |

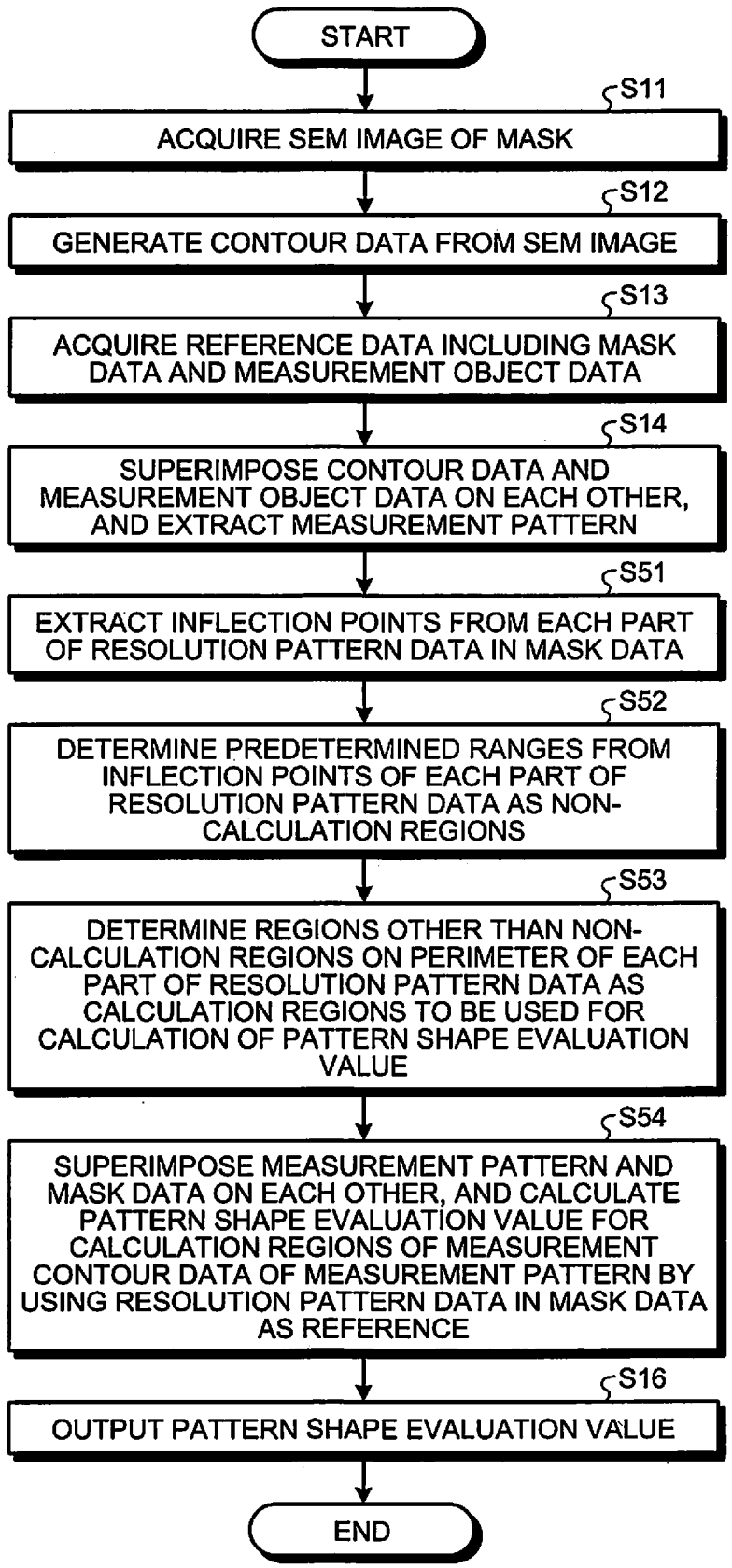

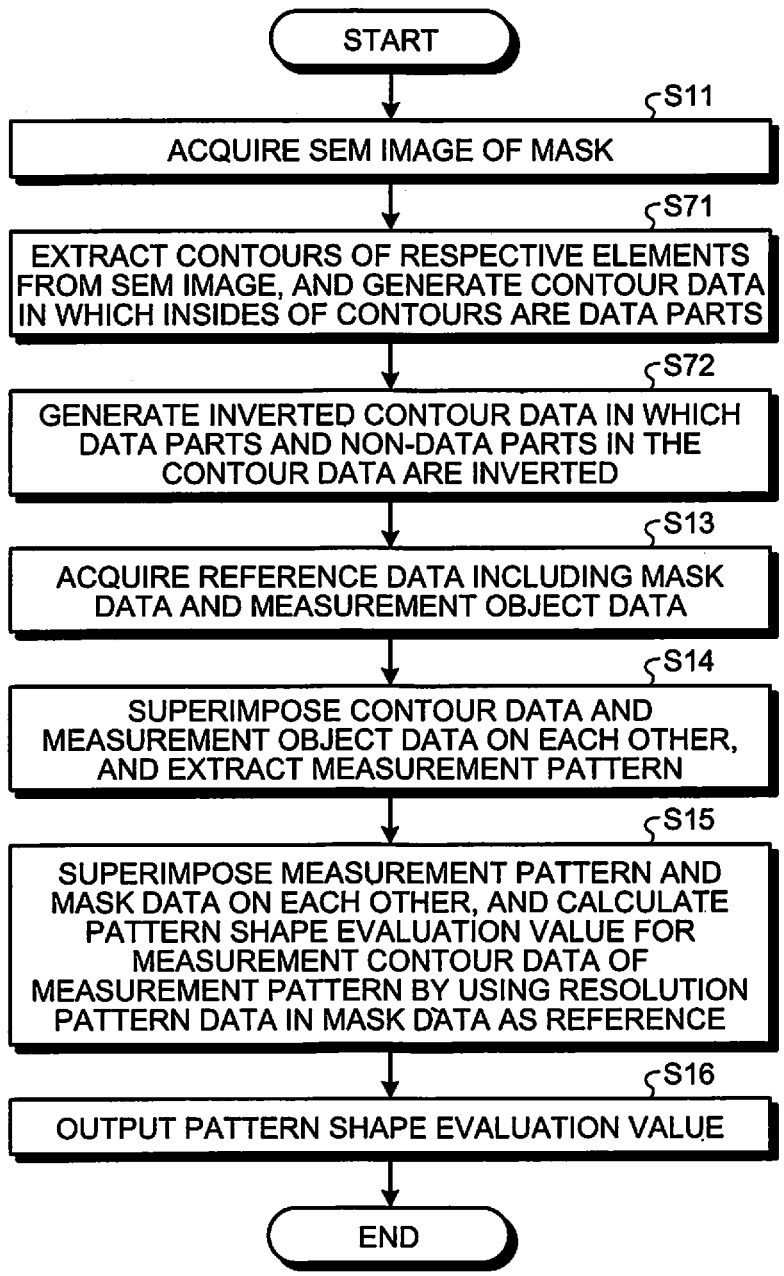

PATTERN SHAPE MEASURING METHOD

CROSS-REFERENCE TO RELATED APPLICATIONS

This application is based upon and claims the benefit of priority from Japanese Patent Application No. 2019-49787, filed on Mar. 18, 2019; the entire contents of which are incorporated herein by reference.

FIELD

Embodiments described herein relate generally to a method of pattern shape measuring.

BACKGROUND

A edge placement error (which will be referred to as EPE, hereinafter) measurement is known, which evaluates a mask pattern shape on the basis of the difference between the mask pattern contour and the mask design data.

However, a pattern shape evaluation value obtained by the EPE measurement can change depending on the pattern size, the pattern shape, the pattern layout, the measurement region etc. Thus, it is not easy to evaluate absolute value without the influence by the pattern category using the EPE measurement.

BRIEF DESCRIPTION OF THE DRAWINGS

FIG. 18 is a flowchart illustrating an example of the sequence of a pattern shape measuring method according to the third embodiment;

FIG. 20 is a flowchart illustrating an example of the sequence of a pattern shape measuring method according to a fourth embodiment;

DETAILED DESCRIPTION

In general, according to one embodiment, an image data of a measurement object including a pattern is acquired. First data is acquired by extracting a contour of an element in composition of the pattern from the image data. Second data that specifies a design data of the measurement object and the pattern of the measurement object is acquired. The design data includes a pattern data. A measurement pattern is extracted by using the first data and the second data. An evaluation value for the measurement pattern with respect to the design data is calculated based on the difference between the measurement pattern and the design data.

Exemplary embodiments of a pattern shape measuring method will be explained below in detail with reference to the accompanying drawings. The present invention is not limited to the following embodiments.

First Embodiment

Figure 1:
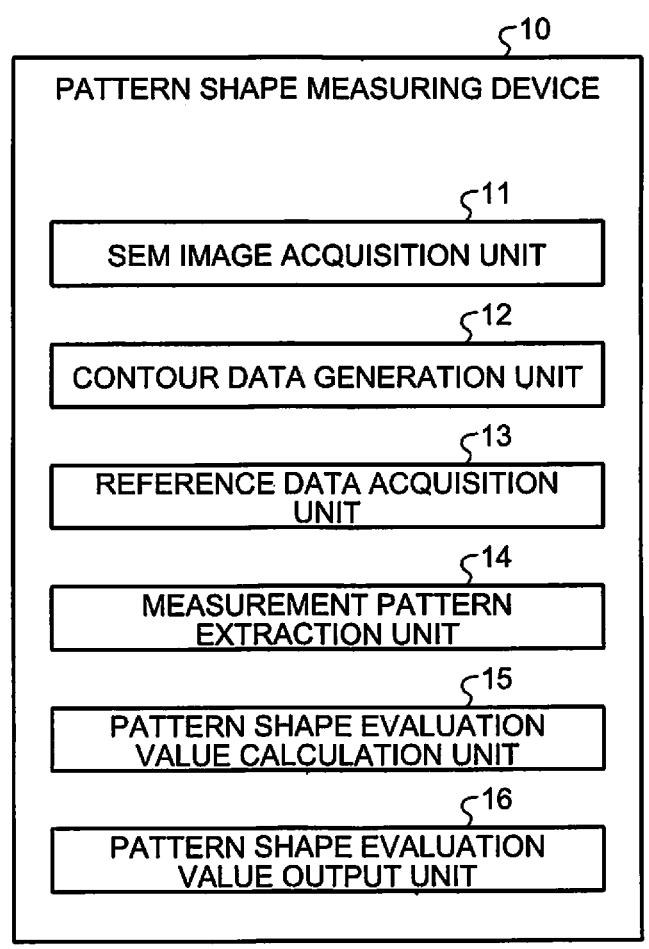
FIG. 1 is a block diagram schematically illustrating a functional configuration example of a pattern shape measuring device that can be used for executing a pattern shape measuring method according to a first embodiment.

FIG. 1 is a block diagram schematically illustrating a functional configuration example of a pattern shape measuring device that can be used for executing a pattern shape measuring method according to a first embodiment. The pattern shape measuring device 10 includes a Scanning Electron Microscope (SEM) image acquisition unit 11, a contour data generation unit 12, a reference data acquisition unit 13, a measurement pattern extraction unit 14, a pattern shape evaluation value calculation unit 15, and a pattern shape evaluation value output unit 16.

Figure 2A:
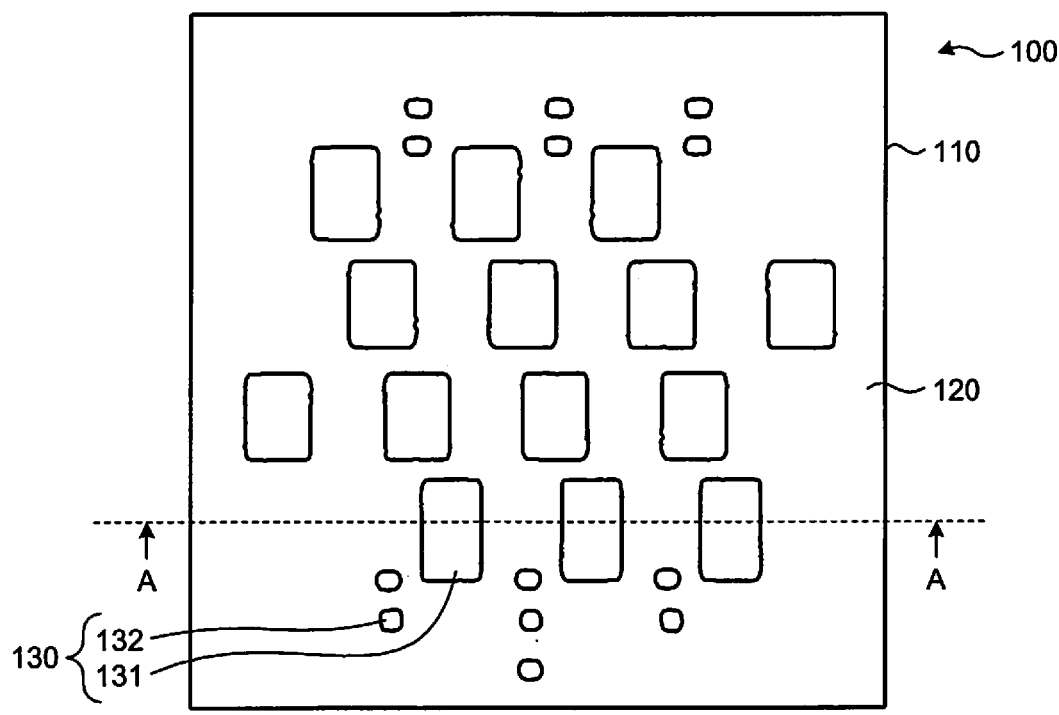
FIGS. 2A and 2B are diagrams schematically illustrating an example of an evaluation object mask.
Figure 2B:
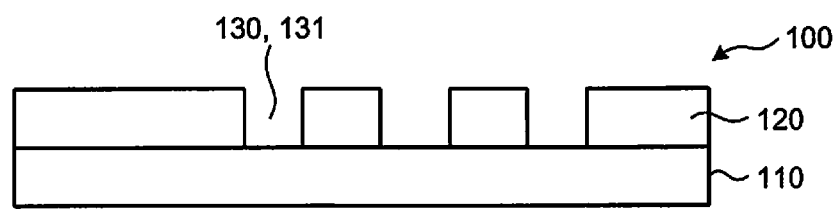

The SEM image acquisition unit 11 is configured to acquire an SEM image formed with generating secondary electron signals by irradiating on the mask pattern of an evaluation object mask. FIGS. 2A and 2B are diagrams schematically illustrating an example of the evaluation object mask. FIG. 2A is a top view, and FIG. 2B is a sectional view taken along a line A-A of FIG. 2A. The mask 100 has a structure in which a light shielding member 120 is provided on a mask substrate 110. Here, the portions of the mask 100 uncovered with the light shielding member 120 serve as opening patterns 130. In this example, the opening patterns 130 includes opening portions 131 that are resolved on a wafer in exposure process, and opening portions 132 that are not resolved on the wafer. In this example, the opening patterns 130 serve as elements that compose the mask pattern.

Figure 3:
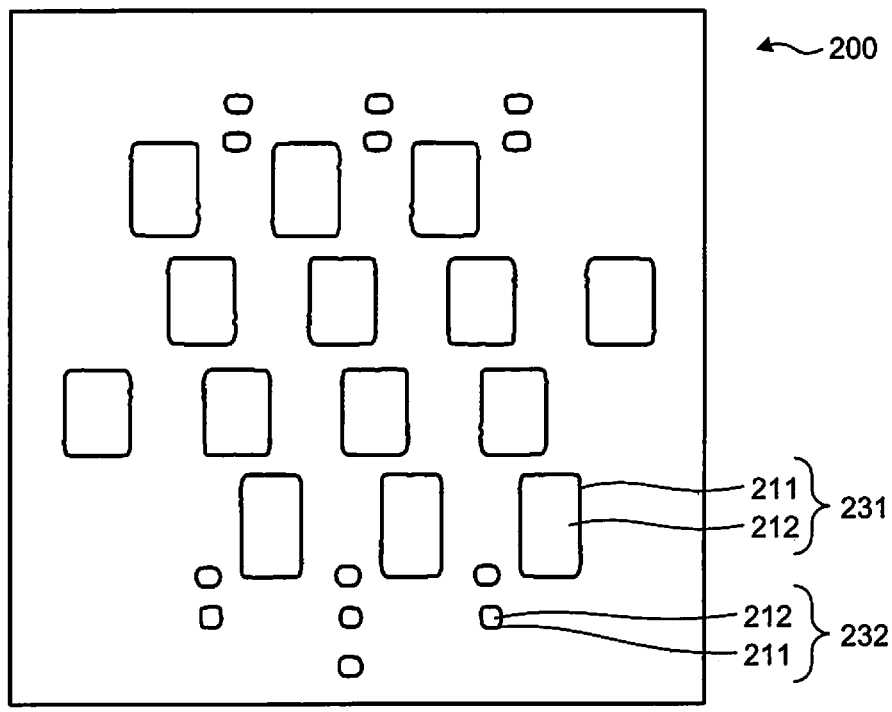
FIG. 3 is a diagram schematically illustrating an example of contour data of the mask of FIGS. 2A and 2B.

The contour data generation unit 12 is configured to generate contour data by extracting the contours of the mask pattern from the SEM image thus acquired. Specifically, the contour data generation unit 12 detects edge points on respective elements in the composition of the mask pattern in the SEM image, and connects the detected edge points while grouping the edge points in units of a closed figure, to generate element contour data. FIG. 3 is a diagram schematically illustrating an example of contour data of the mask of FIGS. 2A and 2B. For example, in the case of the mask 100 of FIGS. 2A and 2B, the contours 211 of the opening patterns 130 are extracted, and the contours 211 and their interiors 212 is defined as the element contour data. The contour data 200 of FIG. 3 includes resolution element contour data 231 corresponding to the opening portions 131 that are resolved on a wafer, as illustrated in FIG. 2A, and non-resolution element contour data 232 corresponding to the opening portions 132 that are not resolved on the wafer. In the contour data 200 of this example, within the image area of the SEM image, the resolution element contour data 231 and the non-resolution element contour data 232, are data parts for which data exists, and the other regions are non-data parts for which data does not exist.

Figure 4:
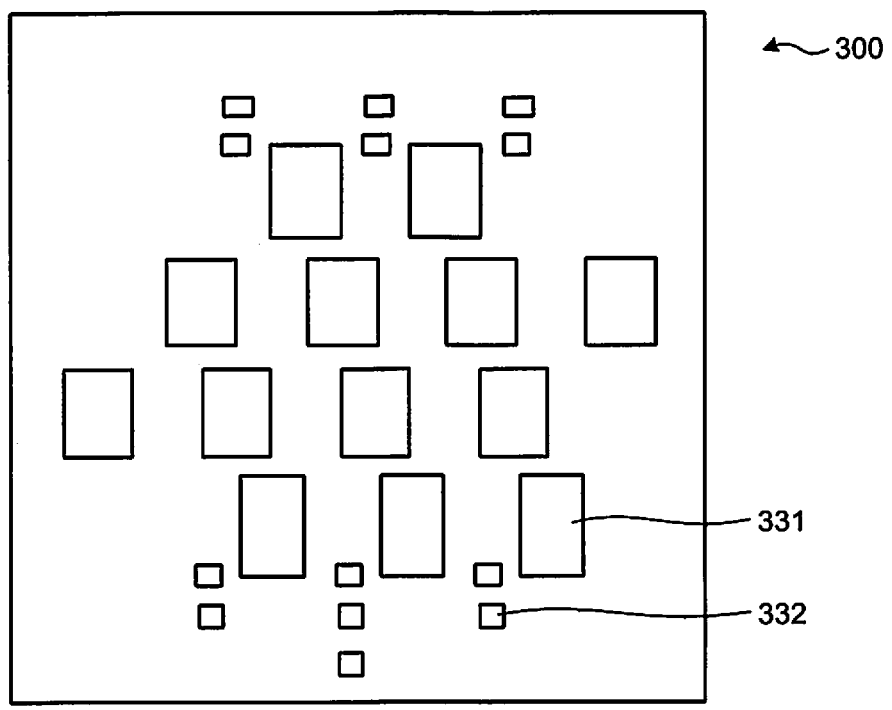
FIG. 4 is a diagram illustrating an example of mask data.

The reference data acquisition unit 13 is configured to acquire reference data corresponding to an evaluation object mask. The reference data is information that specifies data to be referred for calculation of a pattern shape evaluation value. The reference data includes design data of the evaluation object mask 100 (which will be referred to as "mask data", hereinafter), and measurement object data that indicates a measurement object in the mask data. The mask data is data that indicates a desired shape of the mask 100. FIG. 4 is a diagram illustrating an example of the mask data. As illustrated in FIG. 4, the mask data 300 includes resolution pattern data 331 for forming the opening portions 131 that are resolved on a wafer, and non-resolution pattern data 332 for forming the opening portions 132 that are not resolved on the wafer. In this mask data 300, the resolution pattern data 331 and the non-resolution pattern data 332 are data parts for which data exists, and the other regions are non-data parts for which data does not exist. In this example, the non-data parts correspond to the light shielding member 120 of FIG. 2A.

The measurement object data is data that specifies pattern data to be treated as a measurement object. For example, when pattern shape evaluation is to be performed for all the patterns that are resolved on a wafer, the measurement object data is information that indicates the positions of all the parts of the resolution pattern data 331 in the mask data 300. The data called "lithography target data" indicates the information of the positions of all the parts of the resolution pattern data 331. Further, for example, when pattern shape evaluation is to be performed for some patterns of the patterns that are resolved on a wafer, the measurement object data is information that indicates the positions of predetermined parts of the resolution pattern data 331 in the mask data 300.

Figure 5:
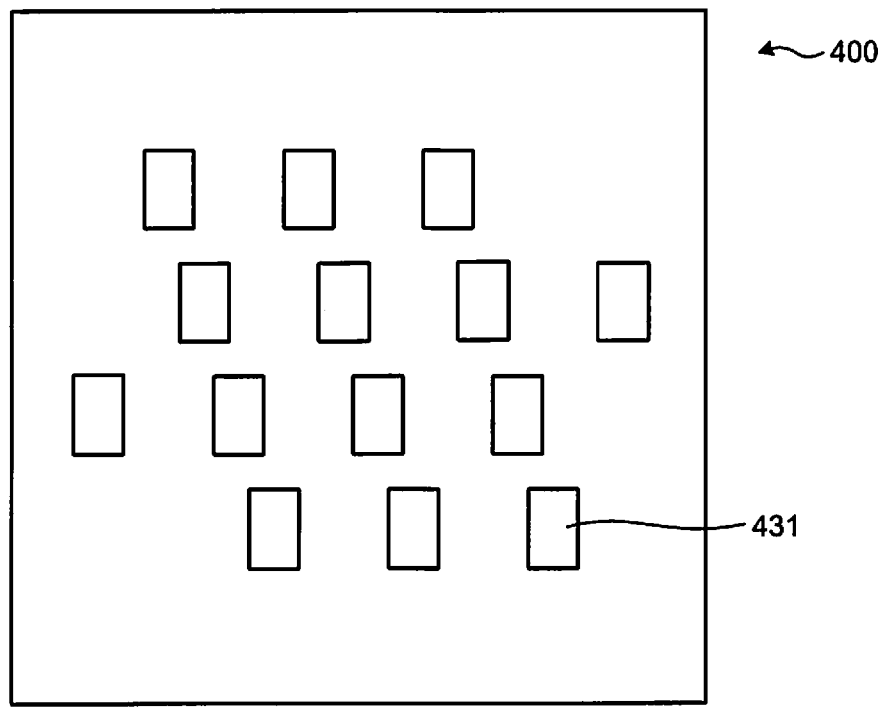
FIG. 5 is a diagram illustrating an example of measurement object data.

FIG. 5 is a diagram illustrating an example of the measurement object data. Here, a case is assumed where the measurement object data is lithography target data. The measurement object data 400 indicates the positions, on the mask, of measurement object patterns 431, which are patterns that are resolved on a wafer. FIG. 5 illustrates a case where the measurement object patterns 431 are arranged with a certain size inside the mask pattern arrangement region. However, the measurement object patterns 431 may be arranged with their barycenter positions present within the mask pattern arrangement region. Here, in this measurement object data 400, the measurement object patterns 431 are data parts for which data exists, and the regions other than the measurement object patterns 431 are non-data parts for which data does not exist.

The measurement pattern extraction unit 14 is configured to extract resolution element contour data 231 to be treated as a measurement object, by using the contour data 200, and the measurement object data 400 in the reference data. Specifically, the measurement pattern extraction unit 14 superimposes the contour data 200 and the measurement object data 400 on each other, and extracts those parts of the resolution element contour data 231 in the contour data 200 which overlap with the data parts of the measurement object data 400 partly or entirely, as a measurement pattern.

Figure 6:
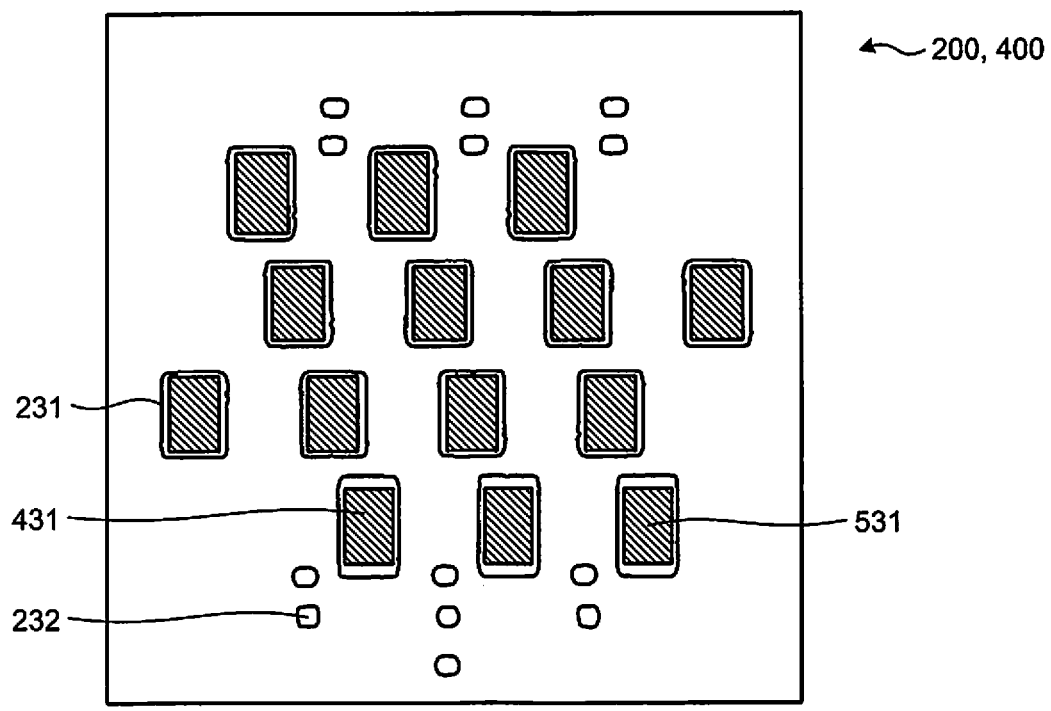
FIG. 6 is a diagram illustrating an example of a state where a measurement pattern is being extracted.
Figure 7:
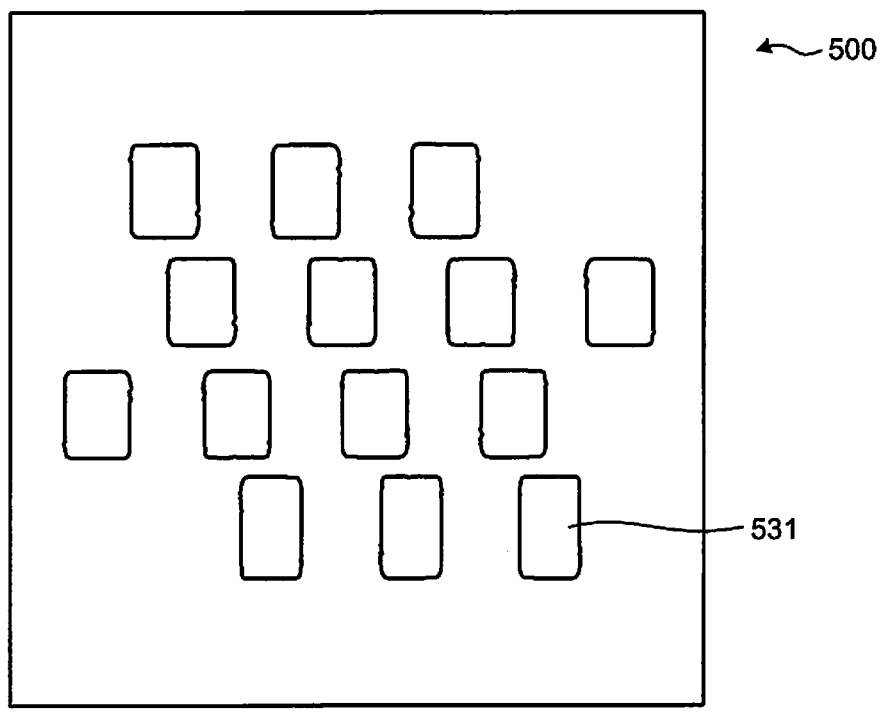
FIG. 7 is a diagram illustrating an example of the measurement pattern.

FIG. 6 is a diagram illustrating an example of a state where the measurement pattern is being extracted. FIG. 7 is a diagram illustrating an example of the measurement pattern. As illustrated in FIG. 6, the contour data 200 of FIG. 3 and the measurement object data 400 of FIG. 5 are superimposed on each other, while a predetermined position is used as a reference. Here, of the resolution element contour data 231 and the non-resolution element contour data 232 in the contour data 200, the resolution element contour data 231 overlaps with the measurement object patterns 431. Then, as illustrated in FIG. 7, only the resolution element contour data 231 overlapping with the measurement object patterns 431 is extracted from the contour data 200, as the measurement pattern 500. The resolution element contour data 231 contained in the measurement pattern 500 will be referred to as "measurement contour data" 531, hereinafter.

Figure 8:
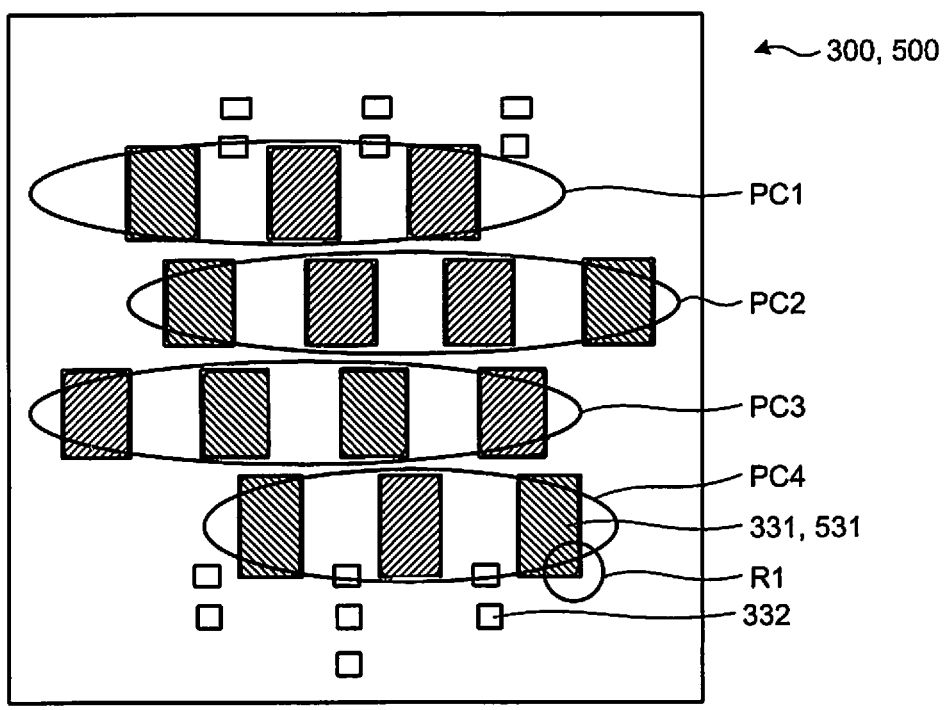
FIG. 8 is a diagram illustrating an example of a view where the measurement pattern of FIG. 7 and the mask data of FIG. 4 are superimposed on each other.

The pattern shape evaluation value calculation unit 15 is configured to superimpose the measurement pattern 500 and the mask data 300 on each other, and to measure the difference between the measurement contour data 531 of the measurement pattern 500 and the resolution pattern data 331 in the mask data 300 to calculate a pattern shape evaluation value. FIG. 8 is a diagram illustrating an example of a view where the measurement pattern of FIG. 7 and the mask data of FIG. 4 are superimposed on each other. FIG. 8 illustrates a state where the mask data 300 of FIG. 4 and the measurement pattern 500 of FIG. 7 are superimposed on each other, while a predetermined position is used as a reference.

Figures 9, 10:
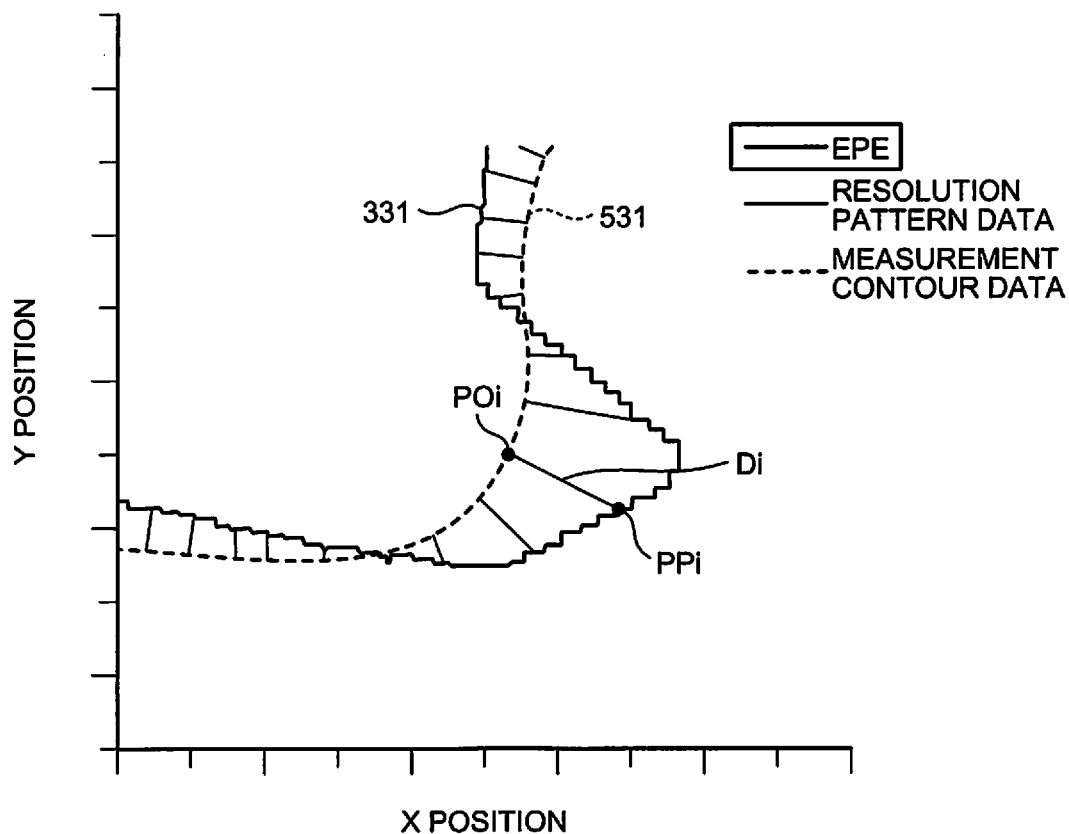
FIG. 9 is a diagram illustrating an example of a region R1 of FIG. 8 in an enlarged state.
FIG. 10 is a diagram illustrating an example of pattern shape evaluation values.

As the pattern shape evaluation value, an arbitrary pattern shape evaluation value can be used. Here, as the pattern shape evaluation value, 2D-MtT is used. 2D-MtT is to evaluate the pattern shape on the basis of the difference between the measurement contour data 531 of the measurement pattern 500 and the resolution pattern data 331 in the mask data 300. FIG. 9 is a diagram illustrating an example of a region R1 of FIG. 8 in an enlarged state. In FIG. 9, the horizontal axis indicates the position in an X-axis direction, and the vertical axis indicates the position in a Y-axis direction. As illustrated in FIG. 9, on the resolution pattern data 331 in the mask data 300, those points are obtained which correspond to respective points on the measurement contour data 531. For example, a tangent line is drawn at a certain point POi on the measurement contour data 531, and a straight line perpendicular to the tangent line is drawn to extend through the point POi. When the straight line intersects with the resolution pattern data 331 at a point PPi, the point PPi is regarded as the point on the resolution pattern data 331 that corresponds to the point on the measurement contour data 531. Thereafter, the distance Di between the two points POi and PPi is obtained. Then, on the basis of the distance between the two points thus calculated, the area of the difference between the measurement contour data 531 and the resolution pattern data 331 is obtained. Then, the area of the difference is standardized by the perimeter length of the resolution pattern data 331. Specifically, where Sout denotes the area of the part at which the measurement contour data 531 treated as the evaluation object is outside the resolution pattern data 331 serving as the reference, Sin denotes the area of the part at which the measurement contour data 531 is inside the resolution pattern data 331, and Lref denotes the perimeter length of the resolution pattern data 331, 2D-MtT is obtained by the following formula (1).

$$2D\text{-}MtT = 2 \times ((Sout+Sin)/Lref)[\text{nm}] \quad (1)$$

As the absolute value of 2D-MtT is smaller, it means that the measurement contour data 531 is more approximate to the resolution pattern data 331.

The pattern shape evaluation value output unit 16 is configured to output the pattern shape evaluation value thus calculated. For example, the pattern shape evaluation value output unit 16 displays the pattern shape evaluation value on a display unit (not illustrated) of the pattern shape measuring device 10. For example, the pattern shape evaluation value is output for every part of the measurement contour data 531 treated as an evaluation object. Alternatively, the pattern shape evaluation value is output for every pattern category classified in accordance with the size or shape. In this case, a representative value, such as the mean value, median value, maximum value, or minimum value, of pattern shape evaluation values for the measurement contour data 531 contained in a pattern category is used as the pattern shape evaluation value for the group.

FIG. 10 is a diagram illustrating an example of pattern shape evaluation values. The example illustrated here is a case where pattern shape evaluation values are output for pattern categories PC1 to PC4 in the measurement pattern of FIG. 8. The resolution pattern data 331 corresponding to the measurement contour data 531 contained in each of the pattern categories PC1 to PC4 has the same shape and size among them. Further, just for reference information, FIG. 10 also shows a 2D-MtT value for a non-measurement pattern calculated from the non-resolution element contour data 232 in the contour data 200 of FIG. 3 and the non-resolution pattern data 332 in the mask data 300 of FIG. 4.

As illustrated in FIG. 10, the 2D-MtT values for the evaluation objects fall within a range of about −3 nm to −4 nm, while the 2D-MtT value for the non-evaluation object is about −13 nm. The non-evaluation object has a large divergence between the non-resolution pattern data 332 and the non-resolution element contour data 232. However, in general, it is the patterns to be resolved on a wafer (patterns corresponding to resolution data patterns) that can mainly contribute to the lithography transfer property. Accordingly, it is sufficient if the pattern shape of the patterns to be resolved on a wafer can be managed. When the resolution element contour data 231 in the contour data 200, which overlaps with the measurement object data 400, is extracted as the measurement pattern 500, the pattern that should be managed in lithography transfer can be measured.

Figure 11:
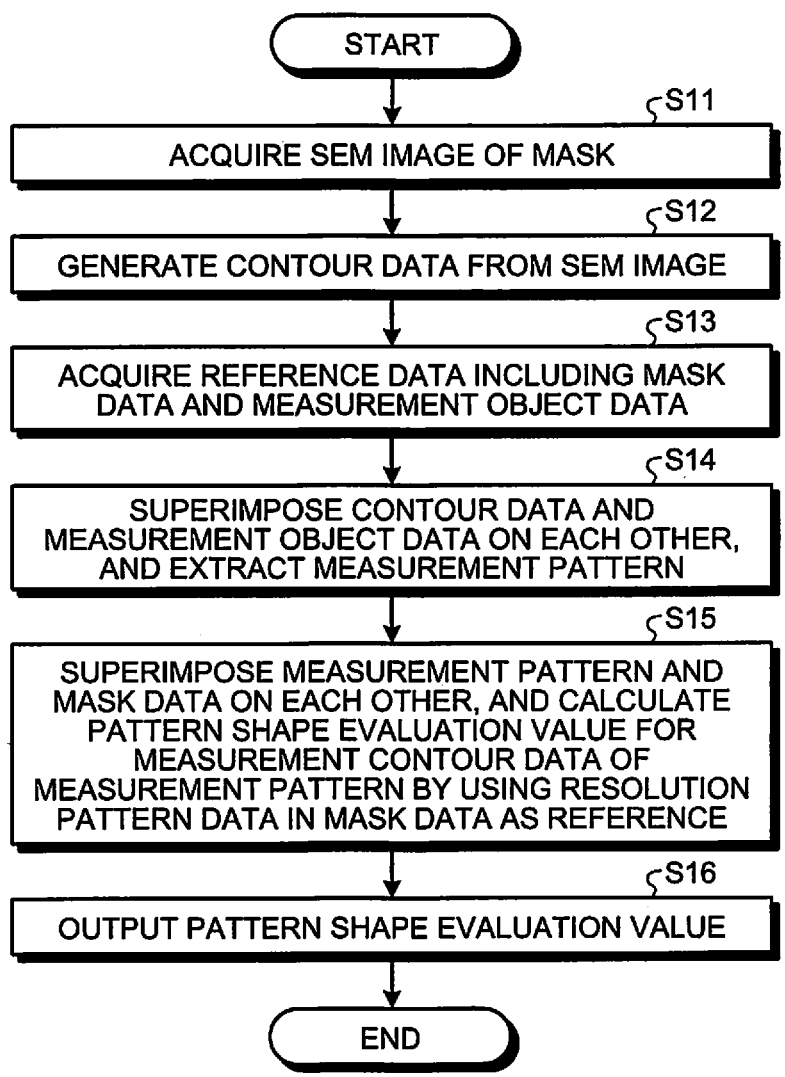
FIG. 11 is a flowchart illustrating an example of the sequence of a pattern shape measuring method according to the first embodiment.

Next, an explanation will be given of a pattern shape measuring method. FIG. 11 is a flowchart illustrating an example of the sequence of a pattern shape measuring method according to the first embodiment. First, the SEM image acquisition unit 11 acquires an SEM image of an evaluation object mask (step S11). Then, the contour data generation unit 12 generates contour data from the SEM image (step S12). Here, for example, the contour data generation unit 12 generates the contour data 200 that includes the resolution element contour data 231 and the non-resolution element contour data 232, as illustrated in FIG. 3.

Thereafter, the reference data acquisition unit 13 acquires reference data that includes mask data and measurement object data corresponding to the evaluation object SEM image (step S13). Here, the reference data acquisition unit 13 acquires the mask data 300 of FIG. 4 and the measurement object data 400 of FIG. 5. Then, the measurement pattern extraction unit 14 superimposes the contour data, and the measurement object data in the reference data, on each other, and extracts those parts of the contour data which overlap with the data parts of the measurement object data partly or entirely, as a measurement pattern (step S14). As illustrated in FIGS. 6 and 7, the measurement pattern 500 contains the measurement contour data 531, which is the resolution element contour data 231 in the contour data 200 overlapping with the measurement object data 400.

Thereafter, the pattern shape evaluation value calculation unit 15 superimposes the measurement pattern, and the mask data in the reference data, on each other, and calculates a pattern shape evaluation value for the measurement contour data of the measurement pattern (step S15). For example, the pattern shape evaluation value calculation unit 15 calculates the area of the contour difference of the measurement contour data 531 of the measurement pattern 500 by using the resolution pattern data 331 in the mask data 300 as a reference, and then standardizes the area of the contour difference by the perimeter length of the resolution pattern data to calculate 2D-MtT as the pattern shape evaluation value. Then, the pattern shape evaluation value output unit 16 outputs the pattern shape evaluation value to, for example, a display device (step S16). Consequently, the sequence ends.

In the first embodiment, the contour data 200 is extracted from an SEM image, and those parts of the resolution element contour data 231 in the contour data 200 which overlap with the data parts of the measurement object data 400 partly or entirely, are extracted as the measurement pattern 500. Then, the measurement pattern 500 and the mask data 300 are superimposed on each other, to calculate a pattern shape evaluation value for the resolution element contour data 231 in the measurement pattern 500 with respect to the resolution pattern data 331 in the mask data 300. In general, it is the patterns to be resolved on a wafer that can mainly contribute to the lithography transfer property. Accordingly, when a pattern shape evaluation value is calculated for the measurement object data 400, which corresponds to the patterns to be resolved on a wafer, it is possible to evaluate the pattern shape of the mask pattern, while suppressing the influence of the size and shape of patterns.

Second Embodiment

In the first embodiment, an explanation has been given of a case where the contour data and the measurement object data are compared with each other to extract the resolution element contour data, which correspond to figures contained in the measurement object data, as a measurement pattern. In the second embodiment, an explanation will be given of a case where the mask data and the measurement object data are compared with each other to extract a measurement pattern.

The pattern shape measuring device 10 according to the second embodiment has a configuration substantially the same as that of FIG. 1. However, the measurement pattern extraction unit 14 is configured to superimpose the mask data 300 and the measurement object data 400 in the reference data on each other, and to extract those parts of the resolution pattern data 331 in the mask data 300 which overlap with the data parts of the measurement object data 400 partly or entirely, as a measurement pattern.

Further, the contour data generation unit 12 is configured to generate the contour data 200 by extracting element contour data for the elements in the SEM image corresponding to the measurement pattern 500. In the first embodiment, when an SEM image is acquired, element contour data is extracted for all the elements contained in the SEM image. In the second embodiment, there is no need to, extract element contour data for all the elements in the SEM image, and thus the time necessary for generating the contour data 200 can be shortened as compared with the first embodiment. Here, the other constituent elements are substantially the same as those explained in the first embodiment, and thus their description will be omitted.

Figure 12:
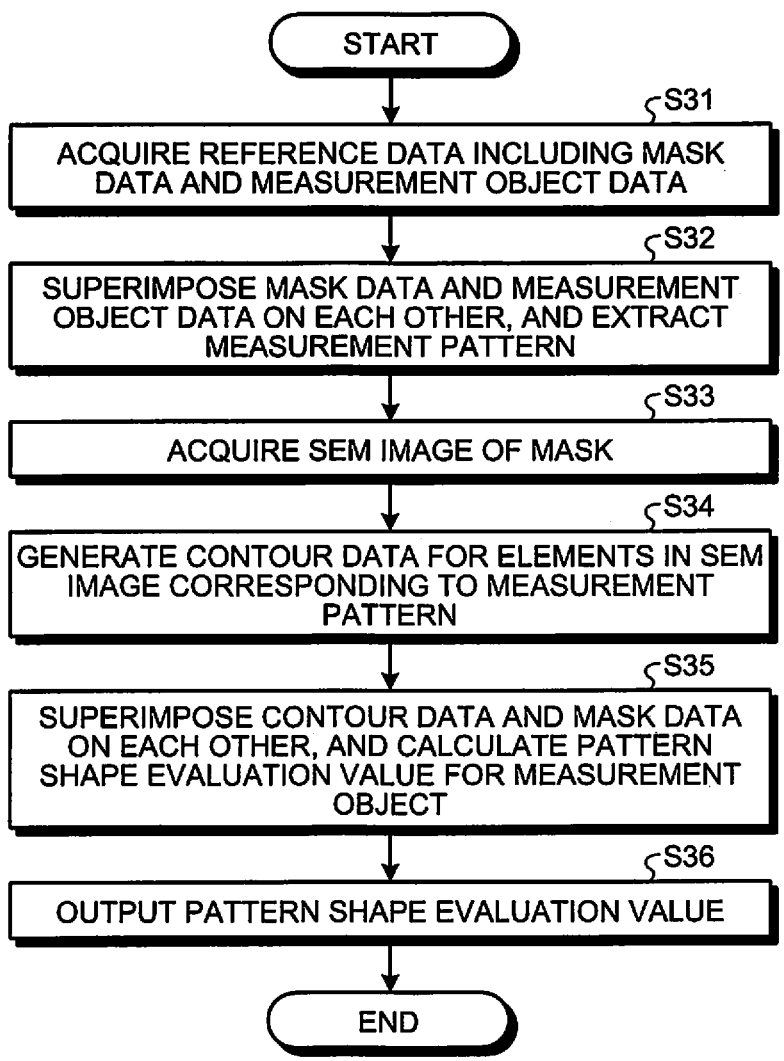
FIG. 12 is a flowchart illustrating an example of the sequence of a pattern shape measuring method according to a second embodiment.

FIG. 12 is a flowchart illustrating an example of the sequence of a pattern shape measuring method according to the second embodiment. First, the reference data acquisition unit 13 acquires reference data that includes mask data 300 and measurement object data 400 (step S31). Then, the measurement pattern extraction unit 14 superimposes the mask data 300 and the measurement object data 400 in the reference data on each other, and extracts those parts of the resolution pattern data 331 in the mask data 300 which overlap with the measurement object data 400, as a measurement pattern 500 (step S32). These processes can be executed in advance before an SEM image is acquired. In other words, the measurement pattern can be determined before the measurement or before the production ordering of the mask.

Thereafter, the SEM image acquisition unit 11 acquires an SEM image of a mask produced on the basis of the mask data 300 (step S33). Then, the contour data generation unit 12 generates contour data 200 for the elements in the SEM image corresponding to the measurement pattern 500 extracted in step S32 (step S34).

Thereafter, the pattern shape evaluation value calculation unit 15 superimposes the contour data 200 and the mask data 300 on each other, and calculates a pattern shape evaluation value, such as 2D-MtT, for the measurement object specified in the measurement pattern 500 (step S35). Then, the pattern shape evaluation value output unit 16 outputs the pattern shape evaluation value (step S16). Consequently, the sequence ends.

Also in the second embodiment, an effect substantially the same as that of the first embodiment can be obtained. Further, after an SEM image is acquired, the contour data 200 is generated for the elements in the SEM image to be treated an evaluation object. Thus, as compared with the first embodiment, the number of elements for generating the contour data 200 is smaller, and it is possible to shorten the time necessary for the process.

Third Embodiment

In the first and second embodiments, a pattern shape evaluation value is calculated by using all the contours in the resolution element contour data in the contour data to be treated as a measurement object. In the third embodiment, an explanation will be given of a case where a region (edge) to be evaluated is selected from the measurement object data. Here, particulars different from the first embodiment will be described.

Figure 13:
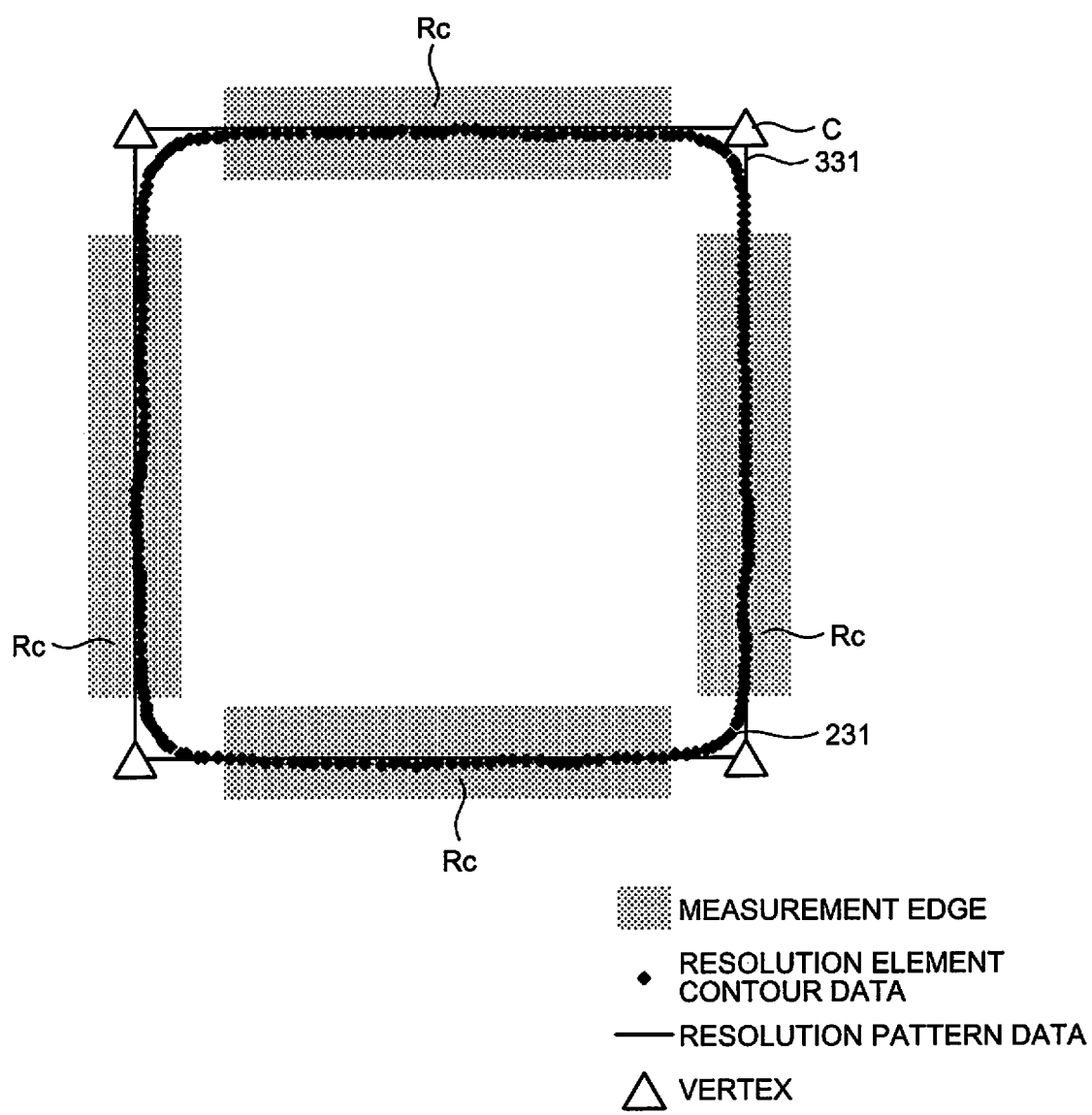
FIG. 13 is a diagram illustrating an example of a result where resolution pattern data of mask data and resolution element contour data acquired from an SEM image are superimposed on each other, the resolution element contour data corresponds to an element of a mask pattern that is resolved on a wafer in exposure process.
Figure 14:
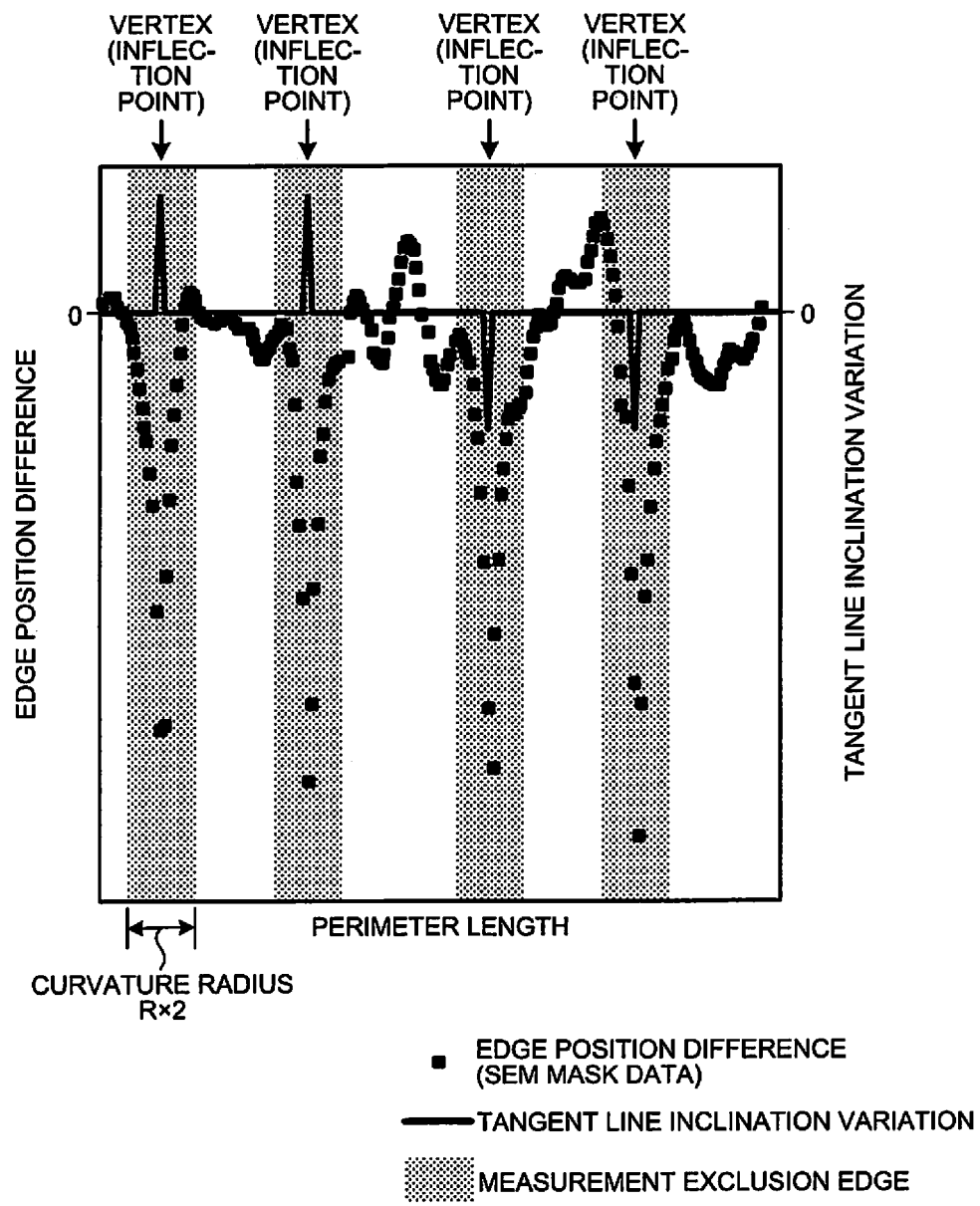
FIG. 14 is a diagram illustrating the relationship of the difference between the resolution pattern data and the resolution element contour data, with positions on the resolution pattern data in FIG. 13.

FIG. 13 is a diagram illustrating an example of a result where resolution pattern data of mask data and resolution element contour data acquired from an SEM image are superimposed on each other. FIG. 14 is a diagram illustrating the relationship of the difference between the resolution pattern data and the resolution element contour data, with positions on the resolution pattern data in FIG. 13. Here, as illustrated in FIG. 13, rectangular resolution pattern data 331 and resolution element contour data 231 are superimposed on each other. FIG. 14 illustrates the relationship of the distance from the barycenter with the difference between the resolution pattern data 331 and the resolution element contour data 231, at respective points on the resolution pattern data 331 and the resolution element contour data 231 in FIG. 13. In FIG. 14, the horizontal axis indicates the distance from the reference position, on the perimeter of the rectangular resolution pattern data 331 or resolution element contour data 231. In FIG. 14, the left vertical axis indicates the difference between the resolution pattern data 331 and the resolution element contour data 231, at points on the perimeter of the resolution pattern data 331, and the right vertical axis indicates the variation in inclination of tangent lines, at the respective points on the resolution pattern data.

As illustrated in FIGS. 13 and 14, it can be seen that the difference between the resolution pattern data 331 and the resolution element contour data 231 becomes larger at about the corner portions (vertexes C) in the mask data 300. This is because roundness is generated at the corner portions due to the proximity effect of the mask process. In order to reduce the influence of roundness at the corner portions in calculation of a pattern shape evaluation value, it may be set to perform the measurement while leaving off the portions including roundness.

In consideration of the above, the third embodiment performs the pattern shape evaluation while excluding regions where the difference between the resolution pattern data 331 and the resolution element contour data 231 is larger than a predetermined value. Specifically, predetermined ranges from respective inflection points on the resolution pattern data 331 are set as non-calculation regions. Then, on the perimeter of the resolution pattern data 331, the regions other than the non-calculation regions are set as calculation regions. Thus, the measurement is performed to the calculation regions to calculate a pattern shape evaluation value. The predetermined range may be defined by the radius (curvature radius R) of roundness at each corner portion generated in the process of producing the mask.

Figure 15:
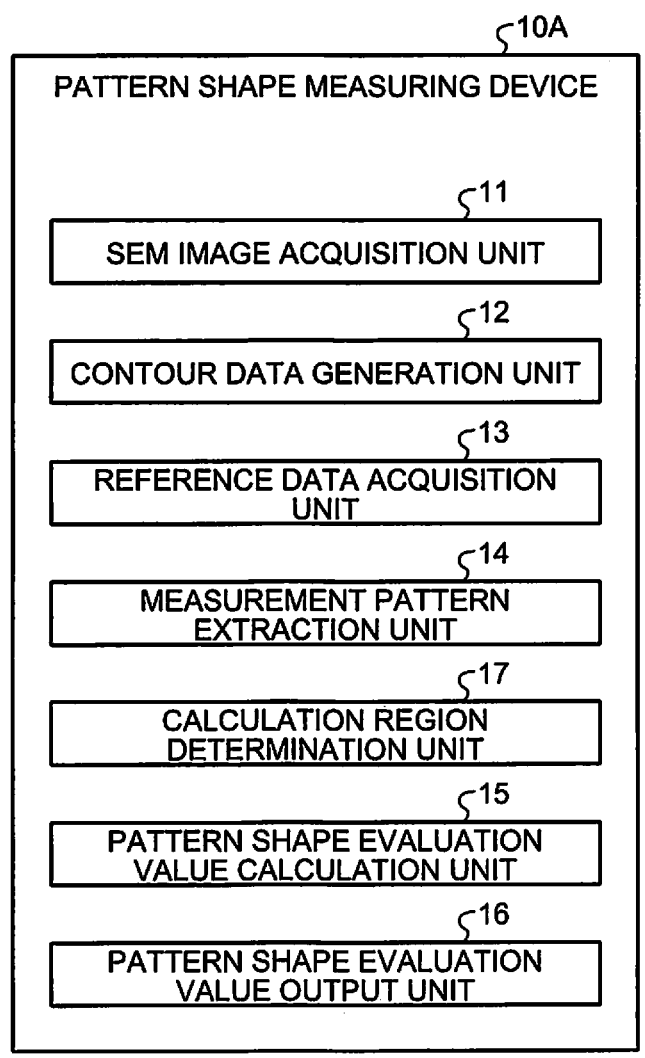
FIG. 15 is a block diagram schematically illustrating a functional configuration example of a pattern shape measuring device according to a third embodiment.

FIG. 15 is a block diagram schematically illustrating a functional configuration example of a pattern shape measuring device according to a third embodiment. The pattern shape measuring device 10A according to the third embodiment further includes a calculation region determination unit 17. The calculation region determination unit 17 is configured to obtain inflection points from the resolution pattern data 331 in the mask data 300 serving as reference data, and to set, as non-calculation regions, the ranges centering the respective inflection points where the divergence between the pattern to be actually formed and the mask data 300 is expected to become larger due to the process. Further, the calculation region determination unit 17 is configured to set, as calculation regions, the regions other than the non-calculation regions on the perimeter of the resolution pattern data 331. Here, when the inclinations of tangent lines at respective points on the resolution pattern data 331 are obtained, the inflection points are found as the points where the signs of the inclinations of the tangent lines change.

The pattern shape evaluation value calculation unit 15 is configured to calculate a pattern shape evaluation value, by the resolution element contour data 231 and the resolution pattern data 331 superimposed on each other at the calculation regions.

For example, in the case of FIG. 13, the inflection points are the corner portions (vertexes C) of the resolution pattern data 331 in the mask data 300, and the regions within predetermined ranges from the respective inflection points are set as non-calculation regions. Consequently, as illustrated in FIG. 13, the regions that exclude these predetermined ranges including the corner portions are set as calculation regions Rc.

Figures 16, 17:
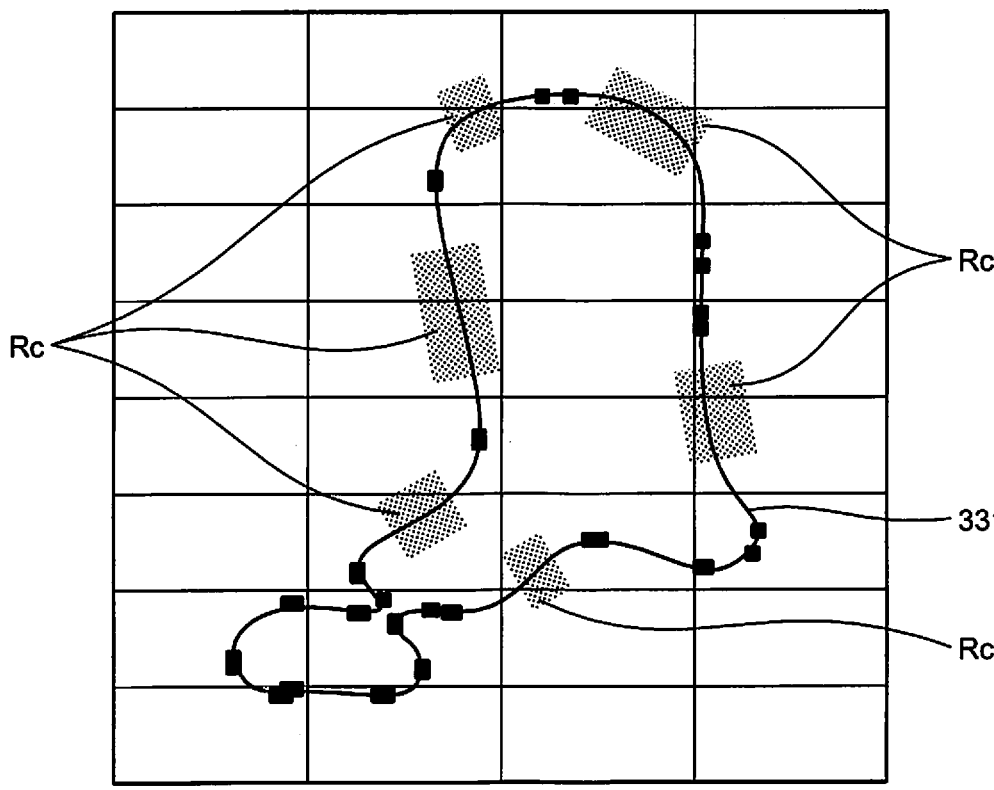
FIG. 16 is a diagram illustrating an example of a calculation region determining method for resolution pattern data having a complicated shape.
FIG. 17 is a diagram illustrating an example of pattern shape evaluation values for resolution element contour data corresponding to the resolution pattern data illustrated in FIGS. 13 and 16.

FIG. 16 is a diagram illustrating an example of a calculation region determining method for resolution pattern data having a complicated shape. First, inflection points are obtained on the perimeter of the resolution pattern data 331. Then, predetermined ranges from these inflection points are set as non-calculation regions. For example, when the radius of roundness at each of the corner portions generated in the process of producing the mask is 100 nm, the regions each within a range of 100 nm are set as the non-calculation regions. Then, the regions other than the non-calculation regions on the perimeter of the resolution pattern data 331 are set as calculation regions Rc. As a result, the calculation process of a pattern shape evaluation value is to be performed, on the basis of six calculation regions Rc illustrated in FIG. 16.

FIG. 17 is a diagram illustrating an example of pattern shape evaluation values for resolution element contour data corresponding to the resolution pattern data illustrated in FIGS. 13 and 16. Here, FIG. 17 also shows a Critical Dimension (CD) measurement value that indicates the dimension variation value of an actual pattern with respect to the design dimension, for the rectangular pattern illustrated in FIG. 13. In the pattern illustrated in FIG. 13, the CD measurement value is −0.84 nm, 2D-MtT is −3.76 nm in the case of measurement performed by using the entire contour of the pattern, and 2D-MtT is −0.58 nm in the case of measurement performed by using only the calculation regions of the pattern in accordance with the method according to the second embodiment. Further, in the pattern illustrated in FIG. 16, 2D-MtT is −2.55 nm in the case of measurement performed by using the entire contour of the pattern, and 2D-MtT is 0.03 nm in the case of measurement performed by using only the calculation regions of the pattern in accordance with the method according to the second embodiment. In both of the pattern illustrated in FIG. 13 and the pattern illustrated in FIG. 16, there is a difference of 2 to 3 nm in the 2D-MtT value between the case of measurement performed by using the entire contour of the pattern and the case of measurement performed by using only the calculation regions of the pattern in accordance with the method according to the second embodiment. On the other hand, in the pattern illustrated in FIG. 13, the CD measurement value and the 2D-MtT value according to the second embodiment have results equivalent to each other. Thus, it is confirmed that, when the measurement is performed on the basis of the calculation regions that exclude the regions including inflection points, an effective method of evaluating the pattern shape of a mask pattern is provided.

FIG. 18 is a flowchart illustrating an example of the sequence of a pattern shape measuring method according to the third embodiment. Here, particulars different from FIG. 11 of the first embodiment will be described. After a measurement pattern is extracted in step S14, the calculation region determination unit 17 extracts inflection points from each part of the resolution pattern data in the mask data specified by the measurement pattern (step S51). Then, the calculation region determination unit 17 determines predetermined ranges from the inflection points as non-calculation regions (step S52), and further determines the regions other than the non-calculation regions on the perimeter of each part of the resolution pattern data as calculation regions to be used for calculation of a pattern shape evaluation value (step S53).

Thereafter, the pattern shape evaluation value calculation unit 15 superimposes the measurement pattern and the mask data on each other, and calculates a pattern shape evaluation value for the calculation regions in the measurement contour data of the measurement pattern by using the resolution pattern data in the mask data as a reference (step S54). Thereafter, the sequence returns to step S16.

Here, in FIG. 18, the third embodiment has been described as being applied to the first embodiment; however, the third embodiment may be applied to the second embodiment. In this case, the flowchart of FIG. 12 needs to be changed such that the processes of steps S51 to S53 are inserted between the steps S32 and S33.

In the third embodiment, the regions excluding predetermined ranges from inflection points on each part of the resolution pattern data 331 in the mask data 300 are determined as calculation regions. Then, a pattern shape evaluation value is calculated for the calculation regions in data obtained by superimposing the resolution element contour data 231 in the contour data 200 and the resolution pattern data 331 on each other. Consequently, the calculation of a pattern shape evaluation value can be performed by excluding the regions where the divergence between the resolution pattern data 331 in the mask data 300 and the resolution element contour data 231 in the contour data 200 is larger. Thus, it is possible to evaluate the pattern shape of the mask more accurately as compared with the first embodiment.

Fourth Embodiment

Figure 19A:
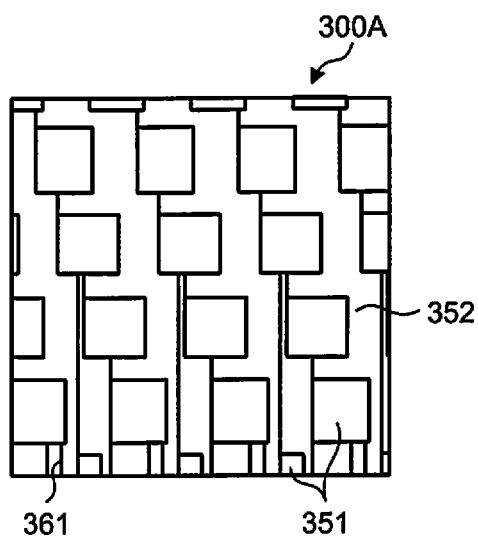
FIGS. 19A to 19D are diagrams illustrating an example of a case where the data structures of mask data and contour data and the data structure of measurement object data are different from each other.
Figure 19B:
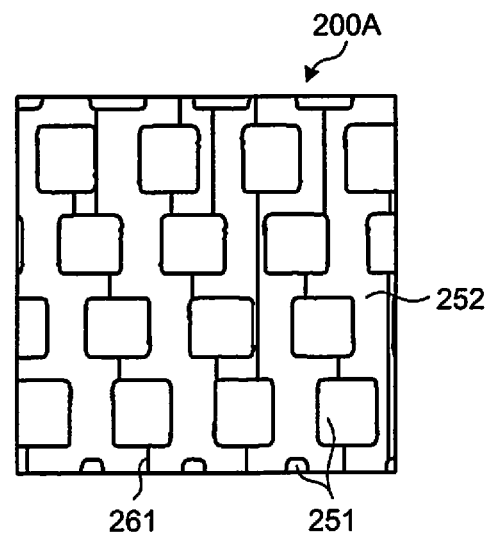
Figure 19C:
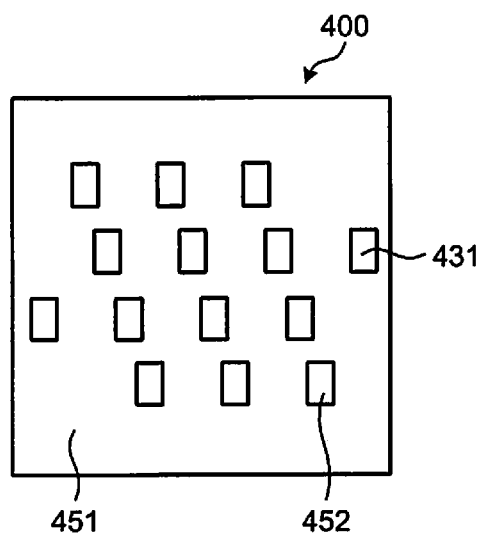
Figure 19D:
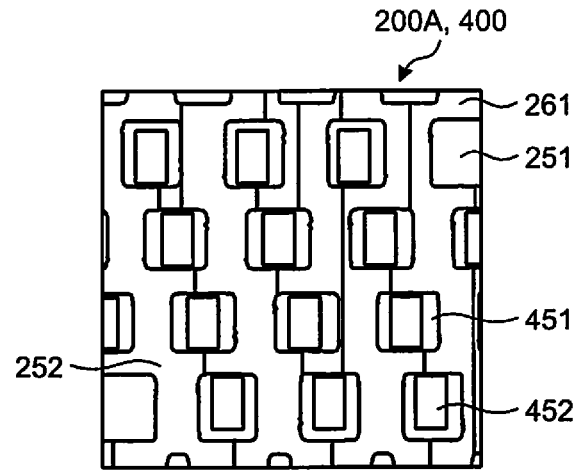

In the above description, an explanation has been given of a case where the regions to be treated as a pattern shape evaluation object in the contour data and the reference data are data parts. However, there is a case where the regions to be treated as a pattern shape evaluation object are data parts, or a case where the regions are non-data parts. FIGS. 19A to 19D are diagrams illustrating an example of a case where the data structures of mask data and contour data and the data structure of measurement object data are different from each other. FIG. 19A illustrates an example of mask data, FIG. 19B illustrates an example of contour data, FIG. 19C illustrates an example of measurement object data, and FIG. 19D illustrates an example of a state where the contour data and the measurement object data are superimposed on each other.

The inverted mask data 300A of FIG. 19A has a data structure in a format that the regions of resolution pattern data and non-resolution pattern data are non-data parts 351 for which data does not exist, and the other regions are data parts 352 for which data exist. Further, the inverted contour data 200A of FIG. 19B has a data structure in a format that the regions where resolution element contour data and non-resolution element contour data exist are non-data parts 251, and the other regions are data parts 252. Thus, a state is formed where the data parts 352 and 252 contain hollow figures formed of the non-data parts 351 and 251. In data containing hollow figures of this type, parting lines 361 and 261 for the figures are included.

On the other hand, the measurement object data 400 of FIG. 19C has a data structure in a format that the positions of measurement object patterns 431 are data parts 452, and the other regions are non-data parts 451. In this case, each of the measurement object patterns 431 has a contour shaped by a closed line, and the region inside the closed line is formed of data.

For example, it is assumed that the inverted contour data 200A and the measurement object data 400 are superimposed on each other to extract a measurement pattern. In this case, as illustrated in FIG. 19D, as the positions of the data parts 252 and 452 are mutually different, no figures are obtained that overlap with each other between the inverted contour data 200A and the measurement object data 400. Thus, a measurement pattern cannot be extracted.

In consideration of the above, when generating the contour data, the contour data generation unit 12 extracts the contours of respective elements in the composition of the mask pattern, and generates contour data 200 containing element contour data in which the insides of the contours are data parts, and inverted contour data 200A in which the data parts and the non-data parts in this contour data 200 are inverted.

Thereafter, in the measurement pattern extraction process, for example, when the regions treated as a pattern shape evaluation object in the reference data are data parts, the process is performed by using contour data in which the regions treated as a pattern shape evaluation object are data parts. Alternatively, for example, when the regions treated as a pattern shape evaluation object in the reference data are non-data parts, the process is performed by using inverted contour data in which the regions treated as a pattern shape evaluation object are non-data parts.

As a result, the two pieces of data to be superimposed on each other are unified in data structure, and thus a measurement pattern can be extracted. Further, also when acquiring a reference pattern, the reference data acquisition unit 13 may perform a process of inverting data parts and non-data parts in acquired reference data.

Figure 21A:
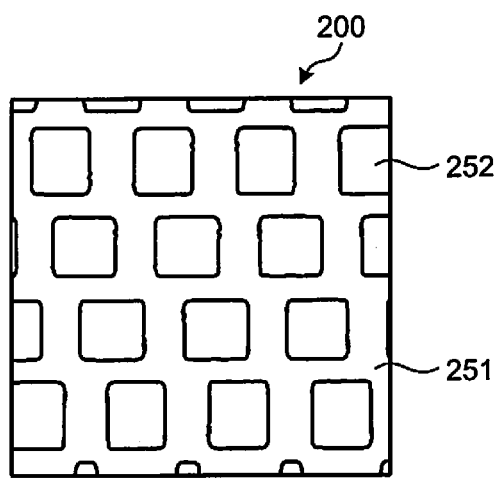
FIGS. 21A to 21C are diagrams schematically illustrating a state where a measurement pattern is being extracted, according to the fourth embodiment.
Figure 21B:
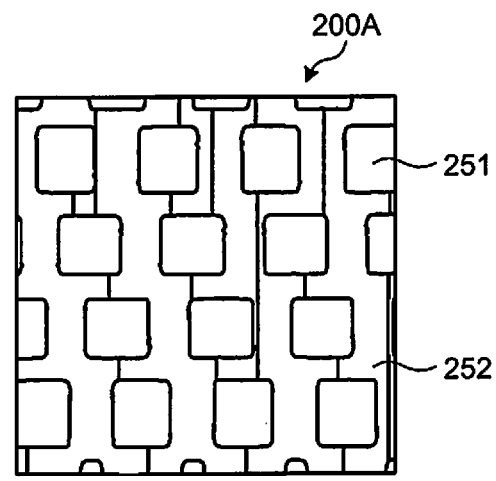
Figure 21C:
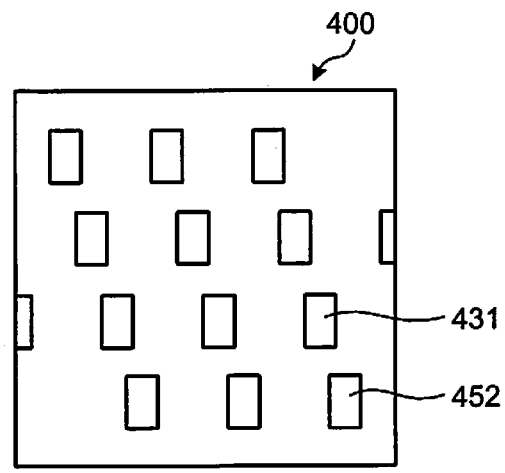

FIG. 20 is a flowchart illustrating an example of the sequence of a pattern shape measuring method according to the fourth embodiment. FIGS. 21A to 21C are diagrams schematically illustrating a state where a measurement pattern is being extracted, according to the fourth embodiment. Here, particulars different from FIG. 11 of the first embodiment will be described. After an SEM image of a mask is acquired in step S11, the contour data generation unit 12 extracts the contours of respective elements in the composition of the mask pattern from the SEM image, and generates contour data 200 in which the insides of the contours are data parts 252, and the other regions are non-data parts 251 (step S71, FIG. 21A).

Further, the contour data generation unit 12 generates inverted contour data 200A in which the data parts 252 and the non-data parts 251 in the contour data 200 are inverted (step S72, FIG. 21B). Thereafter, the sequence proceeds to step S13.

Thereafter, in step S14, when the regions treated as a pattern shape evaluation object in the measurement object data are data parts, the contour data is used to extract a measurement pattern. Alternatively, when the regions are non-data parts, the inverted contour data is used to extract a measurement pattern. For example, as illustrated in FIG. 21C, when the regions of the measurement object patterns 431 in the measurement object data 400 are data parts 452, the contour data 200 illustrated in FIG. 21A, in which the insides of the contours are the data parts 252, and the measurement object data 400 are used to perform the pattern extraction process.

Figure 22A:
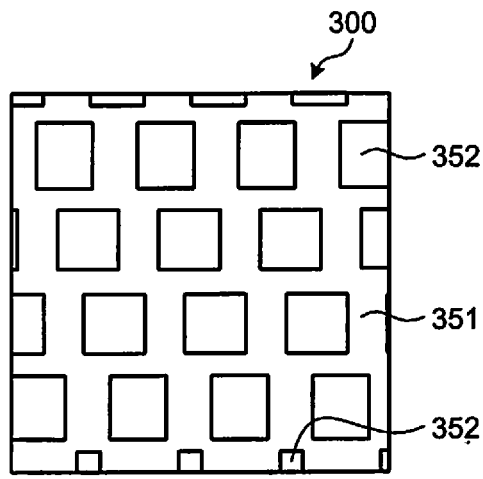
FIGS. 22A and 22B are diagrams illustrating an example of two pieces of mask data having data structures different from each other.
Figure 22B:
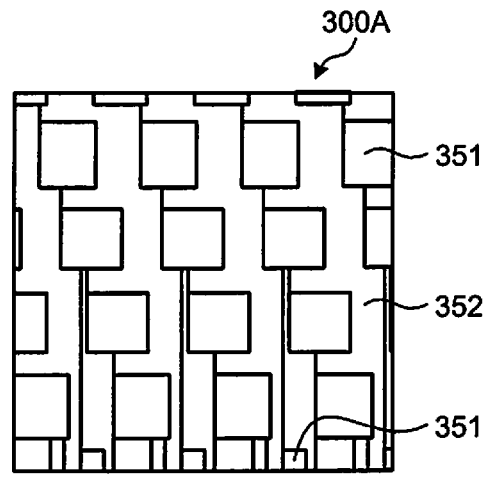

Here, a case is illustrated where, when the contour data 200 is generated, the inverted contour data 200A is generated in which the data parts 252 and the non-data parts 251 in the contour data 200 are inverted. However, when the reference data is acquired, inverted reference data may be generated in which data parts and non-data parts in the reference data are inverted. FIGS. 22A and 22B are diagrams illustrating an example of two pieces of mask data having data structures different from each other. FIG. 22A illustrates mask data 300 in which the regions of resolution pattern data and non-resolution pattern data are data parts 352, and the other regions are non-data parts 351. FIG. 22B illustrates inverted mask data 300A in which the data parts 352 and the non-data parts 351 in FIG. 22A are inverted.

In this case, the calculation process of a pattern shape evaluation value is performed by using the reference data or inverted reference data, which has a data structure corresponding to the data structure of acquired contour data. Further, in a case where the inverted contour data and the inverted reference data are acquired, the contour data and the reference data, in each of which the regions treated as a pattern shape evaluation object are data parts, can be advantageously used such that no parting lines are present therein and thus the difference measurement becomes easier.

In the fourth embodiment, the contour data generation is performed to generate the contour data 200 in which the insides of the contours is data, and the inverted contour data 200A in which the data parts 252 and the non-data parts 251 in the contour data 200 are inverted. Consequently, it is possible to deal with the measurement object data 400, for example, in either case where the regions treated as a pattern shape evaluation object are non-data parts or data parts.

Figure 23:
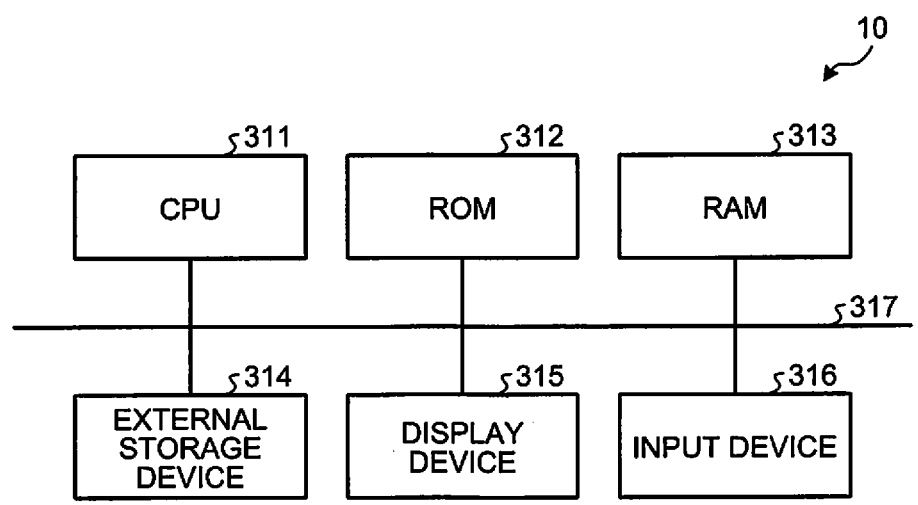
FIG. 23 is a diagram illustrating a hardware configuration of a pattern shape measuring device.

Next, explanation will be give of a hardware configuration of the pattern shape measuring device 10. FIG. 23 is a diagram illustrating a hardware configuration, of the pattern shape measuring device. The pattern shape measuring device 10 includes a Central Processing Unit (CPU) 311, a Read Only Memory (ROM) 312, a Random Access Memory (RAM) 313, an external storage device 314, a display device 315, and an input device 316. In the pattern shape measuring device 10, the CPU 311, the ROM 312, the RAM 313, the external storage device 314, the display device 315, and the input device 316 are connected to each other via a bus line 317.

The CPU 311 uses a pattern shape measurement program, which is a computer program, to calculate a pattern shape evaluation value for resolution element contour data obtained from an SEM image. The pattern shape measurement program is formed of a computer program product that includes a recording medium readable by a computer and nontransitory (nontransitory computer readable recording medium). The recording medium contains a plurality of commands executable by a computer to extract a measurement pattern by superimposing contour data and measurement object data on each other, and to calculate a pattern shape evaluation value for the contour data. In the pattern shape measurement program, the plurality of commands cause the computer to execute the extraction of a measurement pattern, the calculation of a pattern shape evaluation value for the contour data, and so forth.

The external storage device 314 is formed of a Hard Disk Drive (HDD), Solid State Drive (SSD), Compact Disc (CD) drive device, or the like. The display device 315 is formed of a liquid crystal display device or the like. The display device 315 displays a pattern shape evaluation value and so forth on the basis of an instruction from the CPU 311. The input device 316 is formed of a mouse, a keyboard, and so forth.

The pattern shape measurement program is stored in the ROM 312, and can be loaded into the RAM 313 through the bus line 317.

The CPU 311 executes the pattern shape measurement program loaded in the RAM 313. Specifically, in the pattern shape measuring device 10, in response to an instruction input from the input device 316 by a user, the CPU 311 reads the pattern shape measurement program out of the ROM 312, and loads the program into a program storage region formed in the RAM 313, to perform various processes. The CPU 311 temporarily stores various data, generated by these various processes, into a data storage region formed in the RAM 313.

The pattern shape measurement program to be executed by the pattern shape measuring device 10 is formed in a module configuration that contains the SEM image acquisition unit 11, the contour data generation unit 12, the reference data acquisition unit 13, the measurement pattern extraction unit 14, the pattern shape evaluation value calculation unit 15, the pattern shape evaluation value output unit 16, and so forth. These units are loaded into the main storage device, and are generated in the main storage device.

The pattern shape measurement program to be executed by the pattern shape measuring device 10 according to each embodiment has been prepared to perform the method illustrated in FIG. 11, 12, or 18. This program is provided in a state recorded in a computer readable recording medium, such as a CD-ROM, flexible disk (FD), CD-R, or Digital Versatile Disk (DVD), by a file in an installable format or executable format.

Alternatively, the pattern shape measurement program to be executed by the pattern shape measuring device 10 according to each embodiment may be provided such that the program is stored in a computer connected to a network, such as the internet, and is downloaded via the network. Alternatively, the pattern shape measurement program to be executed by the pattern shape measuring device 10 according to each embodiment may be provided such that the program is provided or distributed via a network, such as the internet.

Alternatively, the pattern shape measurement program to be executed by the pattern shape measuring device 10 according to each embodiment may be provided in a state incorporated in an ROM or the like in advance.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern shape measuring method comprising:
   acquiring a second data that specifies design data of a measurement object and a pattern of the measurement object, and the design data includes a pattern data;
   extracting a measurement pattern by using the design data and the second data;
   acquiring image data of the measurement object;
   acquiring a first data by extracting a contour of an element corresponding to the measurement pattern, among elements in composition of the pattern, from the image data; and
   calculating an evaluation value for the design data based on the difference between the first data and the design data.

2. The pattern shape measuring method according to claim 1, further comprising:
   setting a calculation region to calculate the evaluation value in the pattern data,
   wherein, in calculating the evaluation value, the evaluation value for the calculation region of the pattern of the measurement object is calculated.

3. The pattern shape measuring method according to claim 2, wherein, in setting the calculation region includes
   setting a non-calculation region where a variation amount of the element is larger than a predetermined value, and
   setting a calculation region other than the non-calculation region on a perimeter of the pattern data.

4. The pattern shape measuring method according to claim 3, wherein setting the non-calculation region includes
   extracting an inflection point on the perimeter of the pattern data, and
   setting a predetermined range from the inflection point.

5. The pattern shape measuring method according to claim 1, wherein the evaluation value is calculated by standardizing an area of a difference between the pattern data and the contour by using a perimeter length of the pattern data.

6. The pattern shape measuring method according to claim 1, wherein
   the measurement object is a mask, and the design data includes resolution pattern data that are resolved on a wafer by a light exposure process using the mask, and non-resolution pattern data that are not resolved on the wafer, and
   the second data specifies all or part of the resolution pattern data.

7. The pattern shape measuring method according to claim 6, wherein the second data is at a barycenter position of the resolution pattern data.

8. The pattern shape measuring method according to claim 1, wherein,
   the first data comprises a first contour data and a second contour data, and the first contour data includes a data part in which the contour and a region surrounded by the contour are set and a non-data part in which a region other than the data part, and the second contour data includes the data part and the non-data part which are inverted from the first contour data, and
   the evaluation value is calculated by using the first contour data or the second contour data in accordance with a data structure of the design data.

9. The pattern shape measuring method according to claim 1, further comprising:
   generating inverted design data and inverted second data by inverting a data part for which data exists and a non-data part for which data does not exist, in pattern data and a region other than the pattern data in the design data and the second data, wherein the measurement pattern is extracted by using the second data or the inverted second data in accordance with a data structure of the first data, and the evaluation value is calculated by using the design data or the inverted data in accordance with the data structure of the first data.

10. The pattern shape measuring method according to claim 1, wherein the image data is SEM image data.

\* \* \* \* \*